United States Patent [19]

Strandberg

[11] 4,420,793
[45] Dec. 13, 1983

[54] ELECTRICAL EQUIPMENT

[75] Inventor: Lars Strandberg, Västerås, Sweden

[73] Assignee: ASEA Aktiebolag, Västerås, Sweden

[21] Appl. No.: 304,441

[22] Filed: Sep. 21, 1981

[30] Foreign Application Priority Data

Sep. 29, 1980 [SE] Sweden .............................. 8006798

[51] Int. Cl.³ .............................................. H05K 1/14
[52] U.S. Cl. .................... 361/413; 361/412; 361/415
[58] Field of Search ........................ 361/413, 412, 415

[56] References Cited

U.S. PATENT DOCUMENTS

| | | | |
|---|---|---|---|
| 3,087,096 | 4/1963 | Jorgensen | 361/412 X |
| 3,475,657 | 10/1969 | Knowles | 361/413 |
| 3,560,799 | 2/1971 | Bochicchio | 361/412 X |
| 3,657,701 | 4/1972 | Garth | 361/412 X |
| 4,179,172 | 12/1979 | Godsey et al. | 361/413 X |

OTHER PUBLICATIONS

Johnson et al., Printed Circuit Package, IBM Tech. Disc. Bull., vol. 8, #10, Mar. 1966, pp. 1343 & 1344.

*Primary Examiner*—R. R. Kucia
*Attorney, Agent, or Firm*—Pollock, Vande Sande & Priddy

[57] ABSTRACT

Electrical equipment has its components mounted on a plurality of circuit cards. The communication to and from the cards, the supply of supply voltages, etc., take place via conductors arranged on a connection device. The circuit cards are connected to the conductors by means of contact devices. At least some of the conductors are interrupted at each contact device on the connection device. Some of the cards, are slave cards, and are provided with means for bridging the interruptions, whereas others, the main cards, have no such bridging means. By plugging an optional number of slave cards into the connection device immediately adjacent to a main card, a functional unit is formed at an arbitrary location on the connection device. The conductors provided with interruptions form a local bus for internal communication within a multi-card functional unit.

5 Claims, 4 Drawing Figures

ELECTRICAL EQUIPMENT

TECHNICAL FIELD

The present invention relates to electrical equipment which comprises a number of cooperating circuit cards with electrical components applied thereon, and a connection device, common to several circuit cards, with conductors arranged to electrically interconnect the circuit cards together. Each circuit card has a contact device arranged so as to make contact with a corresponding contact device on the connection device which is electrically connected to the conductors of the connection device.

BACKGROUND ART

Certain types of electrical equipment, for example a digital signal processing system, often have components mounted on printed circuit cards, which are inserted into a framework. A back piece of the framework consists of a connection device (also called a back plane or a mother card). This is a circuit card which has edge contacts for each printed circuit card and an electrically conducting pattern consisting of a number of, usually parallel, conductors which connect the edge contacts of each card to each other. The conductors consist of so-called bus conductors (or buses) and are employed for transmitting supply voltages to the circuit cards and for transmitting signals between the circuit cards. The edge contacts of the circuit cards achieve electrical contact between a circuit card and the respective conductors of the connection device when the card is plugged into position in the framework. At the front edge of the circuit cards (i.e. the edge facing away from the connection device) further contacts may be arranged for connecting the cards to external devices, for example an appliance controlled by the equipment, and/or to indicating or operating devices.

The equipment is often divided into functional units, which may each comprise one or more printed circuit cards. One example of a functional unit is an A/D converter. The functional units and the communication between them may be controlled by a programmed unit, for example a microcomputer arranged on a printed circuit card in the framework.

The need for signal transmissions within a functional unit is usually considerably greater than the need for signal transmissions between separate functional units. There is therefore a need to use certain of the conductors of the connection device (i.e. "local buses") for transmitting signals between the printed circuit cards which make up a multi-card functional unit. The conductors used for this purpose must not then extend beyond the outermost circuit cards which make up that functional unit. It will thus often be necessary to employ a special connection device for each specific piece of equipment, the local buses being provided with interruptions at the correct positions to locate functional units. This can become complicated and expensive, and furthermore such a specially adapted piece of equipment will be difficult to change or extend, since each functional unit has a precise location specified from the beginning in the design of the connection device.

Instead of the above-described arrangement, it would be possible to divide the connection device into modules, with one module for each functional unit. However, such a solution would involve problems in accommodating bulky connection members for the bridging of supply voltages as well as providing communication for control signals between the modules. Further, it is not practicable to manufacture modules for all conceivable numbers of printed circuit cards per functional unit, and the space within the framework would therefore be poorly utilized.

OBJECT OF THE INVENTION

The invention aims to provide electrical equipment of the kind described, in which a standardized connection device or back plane may be used independently of the number of printed circuit cards required in the different functional units to be mounted thereon, and in which each functional unit can be positioned at an arbitrary location in the framework and, if desired, be divided into separate frameworks and connection devices.

STATEMENT OF INVENTION

According to the invention, there is provided electrical equipment comprising, a plurality of circuit cards and a connection device common to said plurality of circuit cards, said connection device having conductors arranged to electrically interconnect the circuit cards to each other, a first contact device for each card on the connection device, a second contact device on each circuit card which is arranged so as to make electrical contact with the corresponding first contact device on the connection device, each said first contact device being electrically connected to the conductors of the connection device, which is characterised in that at least some of the conductors of the connection device are interrupted at at least some of the first contact devices, in that the circuit cards comprise at least two main cards and at least one slave card and form a plurality of functional units, each functional unit comprising one main card and optionally one or more slave cards, contact bridge means on the or each slave card for bridging the interruptions in said at least some conductors of the connection device, whereas each main card has no such contact bridge means, the first contact device and the contact bridge means of each slave card being formed in such a way that the cards making up a functional unit are electrically connected to each other, but not to any card in any other functional unit, via the contact bridge means of the slave cards bridging at least one said interruption.

BRIEF DESCRIPTION OF DRAWINGS

The invention will now be further described, by way of example, with reference to the accompanying drawings, in which.

DESCRIPTION OF PREFERRED EMBODIMENT

Figure 1:
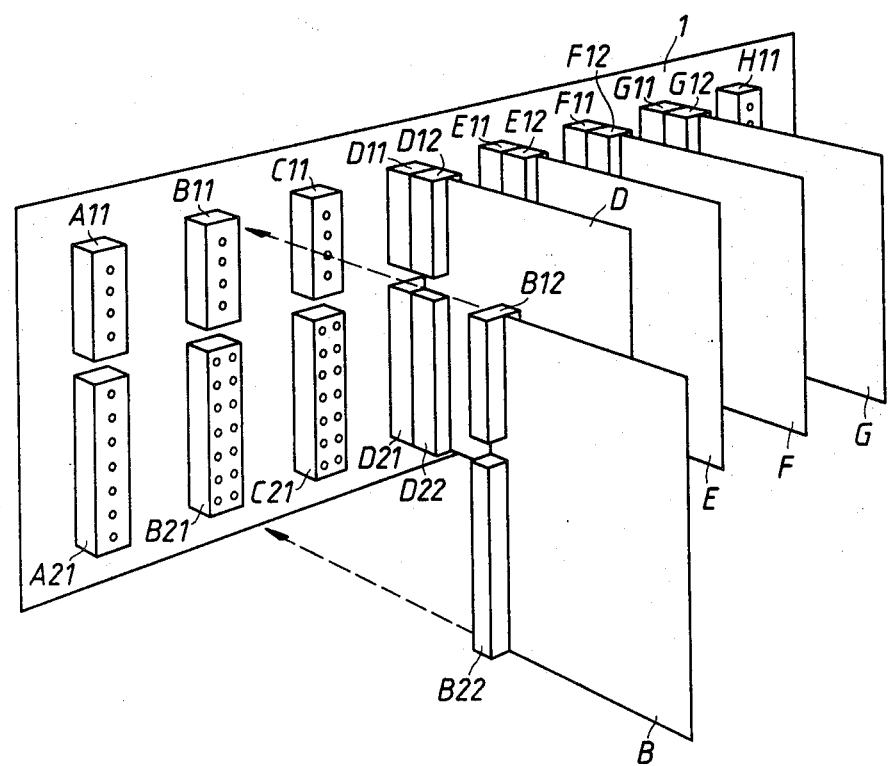
FIG. 1 shows a connection device with a plurality of associated circuit cards.

FIG. 1 shows the connection device 1 arranged vertically within a framework. For the sake of clarity, the framework itself is not shown. The connection device consists of a printed circuit card, that is, a plate of electrically insulating material (e.g. glass-fiber reinforced plastics material) with a conductor pattern on the side not shown in FIG. 1 (the rear side). The conductor pattern consists of a number of parallel and horizontally extending electrical conductors. On the illustrated or front side of the connection device there are arranged a number of first contact devices A11–H11 and A21–H21. The contact devices B11–G11 and B21–G21 are, respectively, intended to receive edge contacts (or second contact devices) B12–G12 and B22–G22 of six circuit cards B–G. When each card is inserted into its correct position in the framework (see the arrows relating to card B), edge contacts B12–G12 make contact with the contact devices B11–G11 of the connection device and likewise the edge contacts B22–G22 make contact with the contact devices B21–G21. The components arranged on each circuit card (none of which are shown in the drawings) and the circuits of which they form a part are connected to the conductors on the rear side of the connection device via the conductive patterns of the circuit cards, the edge contacts of the circuit cards and the contact devices of the connection device.

The contact devices A11 to H11, A21 and H21 each provide a single line of contact poles, whereas the contact devices B21–G21 each provide a double line of contact poles. The contact devices A11, A21 and H11, H21 are intended for the connection of the illustrated connection device to other connection devices, which may, for example, be arranged above and below the connection device 1 shown in FIG. 1.

Figure 2:
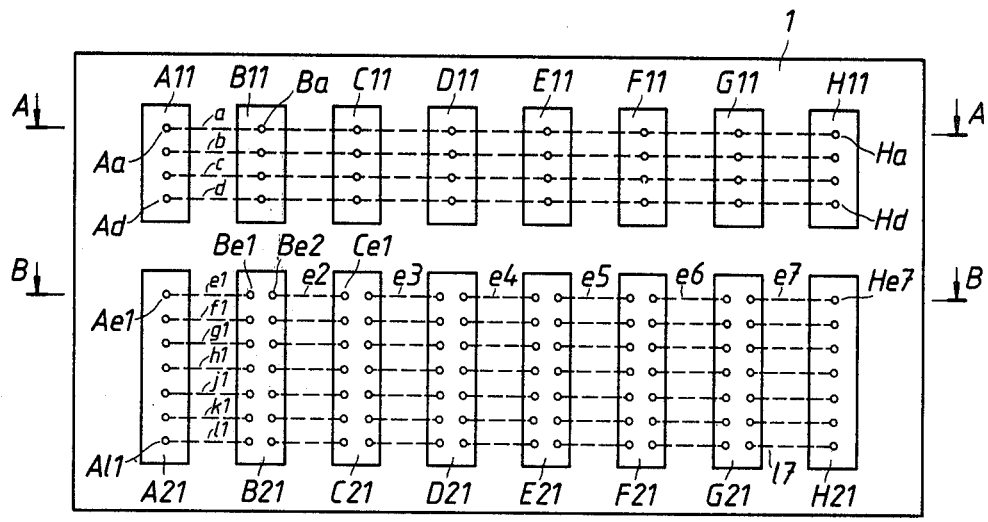
FIG. 2 shows the connection device of FIG. 1 seen from the front.
Figure 3:
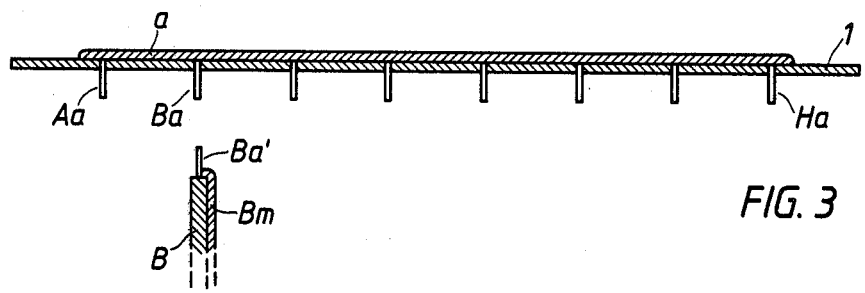
FIGS. 3 and 4 show sections respectively through the connection device on the lines A—A and B—B with scrap sections of circuit cards.
Figure 4:
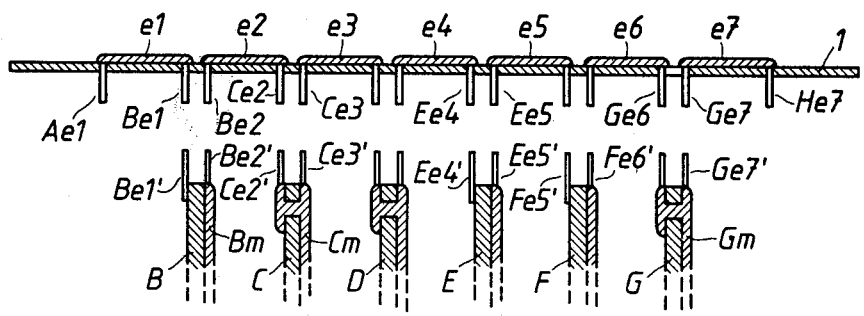

FIG. 2 shows the connection device 1 seen from the front side (the side facing the circuit cards). FIG. 3 shows the section on the line A—A of FIG. 1, which passes through the conductor a on the rear side of the connection device. FIG. 4 shows the section on the line B—B of FIG. 2 which passes through the conductors e1 . . . e7 on the rear side of the connection device.

The conductors a–l on the rear side of the connection device are shown by dashed lines in FIG. 2. For the sake of clarity, only a small number of conductors are shown as an example, but in reality the number of conductors may be considerably greater than that shown.

The four conductors a–d are intended for feeding of electrical power to the circuit cards and for the transmission of data, control signals and other signals between the various functional units. At each card position, the conductors a–d are connected to the single-pole contact devices A11–H11 arranged there, the contacts of said contact devices being designated Aa . . . Ad; Ba . . . Ha . . . Hd.

The seven conductors e–l are intended for communication between the circuit cards within each functional unit and constitute one or several local buses. For example, some of the conductors e–l may be arranged for the transmission of digital address signals in parallel form and would then constitute a so-called address bus. Some of the conductors e–l may be intended for transmission of digital data in parallel form and would then constitute a so-called data bus. Finally, some of the conductors e–l may be intended for transmission of other signals within the functional units.

As can be seen from FIG. 2 each of the conductors e–l is broken into seven sections, an interruption being provided at each contact device B21–G21. The several sections e1–e7, 11–17 of each conductor are therefore electrically insulated from each other. The left-hand end of each conductor section e2–e7 is connected to the righthand contact (Be2) of the respective two-pole contact device B21–G21 located to the left of the conductor section and the right-hand end of each conductor section e1–e6 is connected to the left-hand contact (e.g. Bel, Cel) of the two-pole respective contact device located to the right of the conductor section. The outermost ends of the conductors e–l are connected to the corresponding contacts (Ae1, A11, He7 etc.) of the single-pole contact devices (A21, H21).

The upper part of FIG. 3 shows the conductor a making contact with each of the eight contacts Aa, Ba . . . Ha of the contact devices A11 to H11. The contact Ba' of the circuit card B, shown in the lower part of FIG. 3 makes contact with the contact Ba when the circuit card is inserted into position, the conductor a thus being connected to the conductive pattern Bm of that circuit card. The other conductors b, c and d, the other contacts in the upper contact devices A11–H11 of the connection device and the edge contacts B12–G12 of the circuit cards are designed in a corresponding manner.

The upper part of FIG. 4 shows a section through the conductor e and the lower part of FIG. 4, the circuit cards B–G. The conductor sections e1–e7 are connected to the contacts Ae1, Be1 etc. in the manner described above. The circuit cards are of two kinds, namely, main cards (B, E, F) and slave cards (C, D, G). The edge contacts of the cards (e.g. B) each have two contacts (Be1' and Be2') for each conductor (e.g. e) in the local bus (e–l). In case of a main card, the right-hand one of these contacts (Be2') is connected to the conductive pattern (Bm) of the card and thereby to the components and circuits arranged on that card. The left-hand contact (Be1'), on the other hand, is not connected and has no function, and may therefore be omitted. This means that one main card (e.g. B) is connected only to the section (e2) of the local bus located on the right-hand side of the card. In the case of a slave card (e.g. C), on the other hand, both contacts (Ce2' and Ce3') are electrically connected to each other, for example through a portion of the conductive pattern (Cm) of the card passing through an opening in the card. This results in a contact bridge being formed, so that the conductor sections (e2, e3) to the right and to the left of the slave card are interconnected via said contact bridge to cause the conductive pattern Cm of the slave card to be connected to both of the said conductor sections.

For the other conductors f–l in the local bus, the connection device and the circuit cards are designed in a similar manner.

Each functional unit is designed so as to contain just one main card. This may be placed at any arbitrary place in the framework. It is then connected to the common buses (conductors a–d) as well as to the section of the local bus (e–l) which is positioned immediately to the right of the card.

If the functional unit contains more than just a main card, the other cards in the unit are designed as slave cards and are inserted in arbitrary sequence immediately to the right of the main card of the functional unit. In the manner described above, each slave card switches the local bus one step further, whereby all cards within the functional unit are connected to the local bus.

The local bus of a functional unit is interrupted to the left of the main card of that unit and to the right by another main card, no card, or by an empty card lacking any electrical connection between its contacts.

In the example described, the cards B, C and D thus constitute one functional unit, where the local bus is constituted by the conductor sections e2–e4, f2–f4, and so on. The card E forms one functional unit by itself.

Finally, the main card F and the slave card G constitute a third functional unit with the local bus e6–16.

As described above, the local bus may be extended further by means of the contact devices A21 and H21 to other frameworks and connection devices, and a functional unit may therefore have cards connected to different connection devices.

The main cards may be connected to all the common conductors a–d, whereas the slave cards need only be connected to the conductor or conductors responsible for feeding the supply voltages to the cards. The main card in each functional unit then controls the slave cards in that functional unit (via the local bus) as well as the communication within the functional unit on the local bus.

In an equipment according to the invention, functional units consisting of one or more cards may be arbitrarily mixed and located at arbitrary positions in the framework or the frameworks. The equipment may be modified in a simple manner or be extended by rearranging cards and inserting new cards without any other restrictions than that the slave cards within a functional unit must be placed immediately adjacent to, and on a specified side of, the main card of that unit. This is a consequence of the division of the local bus between the units not being controlled by the design of the connection device, but being performed automatically upon the insertion of the cards.

Further, considerable advantages are obtained from the point of view of economy and production technique by the fact that one and the same type of connection device can be used independently of the division of the cards into functional units.

In the above an equipment is described in which the or the first slave card in a unit is located immediately to the right of the main card. Alternatively, the equipment may be designed so that the or the first slave card is located immediately to the left of the main card.

The invention is not limited to digital equipment where the connections between the cards and the units are in the form of data buses. The above-described principle may be applied to other forms of electrical equipment with arbitrary signal contents in the conductors.

The invention has been specifically described with reference to a form of equipment in which the circuit cards and the connection device are all in the form of printed circuits. However the invention also extends to cards and connection devices in which the conductors consist of electrically conducting wires.

What is claimed is:

1. Electrical equipment comprising:
    a connection device including a plurality of mating contact devices, each of which receives a circuit card contact device, said connection device including a plurality of conductors, each beginning at one of said mating contact devices and ending at another of said mating contacting devices; and
    a plurality of electronic functional units, each unit including a main circuit card and at least one slave circuit card, all of said circuit cards including a contact device inserted in said mating contact device providing a plurality of electrical connections to a respective circuit card, said slave circuit card including a contact bridge means for connecting one of said plurality of conductors to another of said conductors through said circuit card connection device and a respective mating connection device, whereby a functional unit is formed between a slave card and a main circuit card having a local bus formed by said plurality of conductors isolated from other functional units.

2. Electrical equipment according to claim 1, wherein said electric circuit card contact devices and said mating contact devices have two poles, a conductor which extends to a first mating contact device from one direction being connected to one pole of a mating contact device, and a conductor extending to said mating contact device from the other direction being connected to the other pole of said mating contact device.

3. Electrical equipment according to claim 2, wherein the contact bridge means of each slave card consists of an electrical connection between the two poles of the circuit card contact device of the slave card.

4. Electrical equipment according to claim 1, 2 or 3 wherein the connection device includes some conductors which are through-conductors and are not provided with any interruption.

5. Electrical equipment according to claim 1, 2 or 3, wherein said contact devices of each circuit card are each in two parts, a first part being employed for connecting each circuit card to a plurality of through conductors on the connection device and a second part for interconnecting the main card of a functional unit with an adjacent slave card of the same functional unit.

* * * * *